(12) United States Patent
Kim et al.

(10) Patent No.: US 11,888,484 B2
(45) Date of Patent: Jan. 30, 2024

(54) CIRCUITRY HAVING FULLY CONNECTED RING OSCILLATORS

(71) Applicant: Regents of the University of Minnesota, Minneapolis, MN (US)

(72) Inventors: Hyung-Il Kim, Minneapolis, MN (US); William Moy, Minneapolis, MN (US); Hao Lo, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 17/975,825

(22) Filed: Oct. 28, 2022

(65) Prior Publication Data

US 2023/0132603 A1 May 4, 2023

Related U.S. Application Data

(60) Provisional application No. 63/272,795, filed on Oct. 28, 2021, provisional application No. 63/297,364, filed on Jan. 7, 2022.

(51) Int. Cl.
| | |
|---|---|
| *H03K 3/03* | (2006.01) |
| *H03K 5/19* | (2006.01) |
| *G06N 10/00* | (2022.01) |
| *B82Y 10/00* | (2011.01) |
| *G06N 5/04* | (2023.01) |
| *G06F 17/11* | (2006.01) |

(52) U.S. Cl.
CPC ............ *H03K 3/0315* (2013.01); *B82Y 10/00* (2013.01); *G06F 17/11* (2013.01); *G06N 5/04* (2013.01); *G06N 10/00* (2019.01); *H03K 5/19* (2013.01)

(58) Field of Classification Search
CPC ........ H03K 3/0315; H03K 5/19; G06N 10/00; G06N 5/03; G06N 5/04; B82Y 10/00; H01L 27/18; G06F 17/11
USPC ..................................... 331/2, 57; 326/41, 47
See application file for complete search history.

(56) References Cited

U.S. PATENT DOCUMENTS

| 11,545,963 | B1 * | 1/2023 | Zick ...................... H03K 3/0322 |
| 2021/0152125 | A1 * | 5/2021 | Chou .................... H03B 5/1228 |
| 2021/0312298 | A1 | 10/2021 | Kim et al. |

OTHER PUBLICATIONS

A Probabilistic Compute Fabric Based on Coupled Ring Oscillators for Solving Combinatorial Optimization Problems IEEE Journal of Solid-State Circuits, vol. 56, No. 9, Sep. 2021( publ Mar. 12, 2021) Ibrahim Ahmed , Po-Wei Chiu , Member, IEEE, William Moy , and Chris H. Kim , Fellow, IEEE (Year: 2021).*

(Continued)

*Primary Examiner* — Arnold M Kinkead
(74) *Attorney, Agent, or Firm* — Brian D. Kaul; Westman, Champlin & Koehler, P.A.

(57) ABSTRACT

A fully connected ring oscillator circuit includes a plurality of first ring oscillator loops, a plurality of second ring oscillator loops, a plurality of ring oscillators and a plurality of coupled ring oscillators. Each first ring oscillator loop extends along a first axis. Each second ring oscillator loop extends along a second axis that is transverse to the first axis and intersects each of the first ring oscillator loops. Each ring oscillator includes one of the first ring oscillator loops connected to one of the second ring oscillator loops. Each coupled ring oscillator includes two of the ring oscillators that are connected to each other through a programmable weighted coupling block.

20 Claims, 7 Drawing Sheets

(56) References Cited

OTHER PUBLICATIONS

M. Johnson, et al., "Quantum Annealing with Manufactured Spins," Nature, vol. 473, pp. 194-198, 2011.
M. Yamaoka, C. Yoshimura, M. Hayashi, T. Okuyama, H. Aoki and H. Mizuno, "A 20k-Spin Ising Chip to Solve Combinatorial Optimization Problems With CMOS Annealing," in IEEE Journal of Solid-State Circuits, vol. 51, No. 1, pp. 303-309, Jan. 2016, doi: 10.1109/JSSC.2015.2498601.
T. Takemoto, M. Hayashi, C. Yoshimura and M. Yamaoka, "2.6 A 2 x30k-Spin Multichip Scalable Annealing Processor Based on a Processing-In-Memory Approach for Solving Large-Scale Combinatorial Optimization Problems," 2019 IEEE International Solid-State Circuits Conference—(ISSCC), San Francisco, CA, USA, 2019, pp. 52-54, doi: 10.1109/ISSCC.2019.8662517.
A. Lucas, "Ising Formulations of Many NP Problems," Front. Phys., vol. 2, No. 5, pp. 1-15, 2014.
M. X., Goemans, et al., "Improved Approximation Algorithms for Maximum Cut and Satisfiability Problems Using Semidefinite Programming," JACM, vol. 42, No. 6, pp. 1115-1145, 1995.
I. Ahmed, et al., "A Probabilistic Self-annealing Compute Fabric based on 560 Hexagonally Coupled Ring Oscillators for Solving Combinatorial Optimization Problems," 2020 IEEE, Dept. of ECE, University of Minnesota, Minneapolis, MN, USA, 2020, 2 pgs.
I. Ahmed, et al., "A Probabilistic Compute Fabric Based on Coupled Ring Oscillators for Solving Combinatorial Optimization Problems," IEEE Journal of Solid-State Circuits, 2021 IEEE, 11 pgs.
U.S. Appl. No. 17/213,396, filed Mar. 26, 2021, entitled "Probabilistic Compute Engine Using Coupled Ring Oscillators", 26 pages.
A. Mallick, M. Khairul Bashar, D. Truesdell, et al., "Using Synchronized Oscillators to Computer the Maximum Indepdendent Set", Nature Communications, 2020, 7 pages.
J. Chou, S. Bramhavar, S. Ghosh, et al., "Analog Coupled Oscillator Based Weighted Ising Machine", Scientific Reports, 2019, 10 pages.
P. Xiao, "Optoelectronics for refrigeration and analog circuits for combinatorial optimization" Electrical Engineering and Computer Sciences, University of California at Berkeley, Technical Report No. UCB/EECS-2019-74, http://www2.eecsberkeley.edu/Pubs/TechRpts/2019/EECS-2019-74.html. May 17, 2019, 155 pgs.

\* cited by examiner

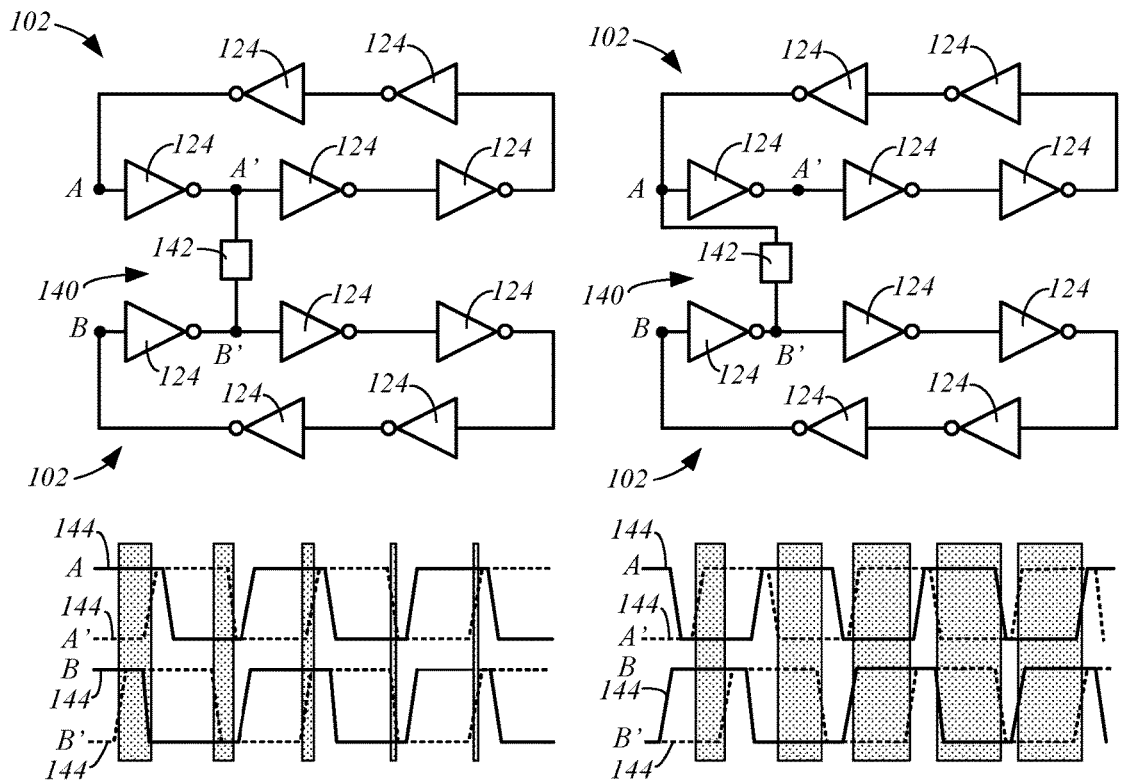
FIG. 6A
FIG. 6B
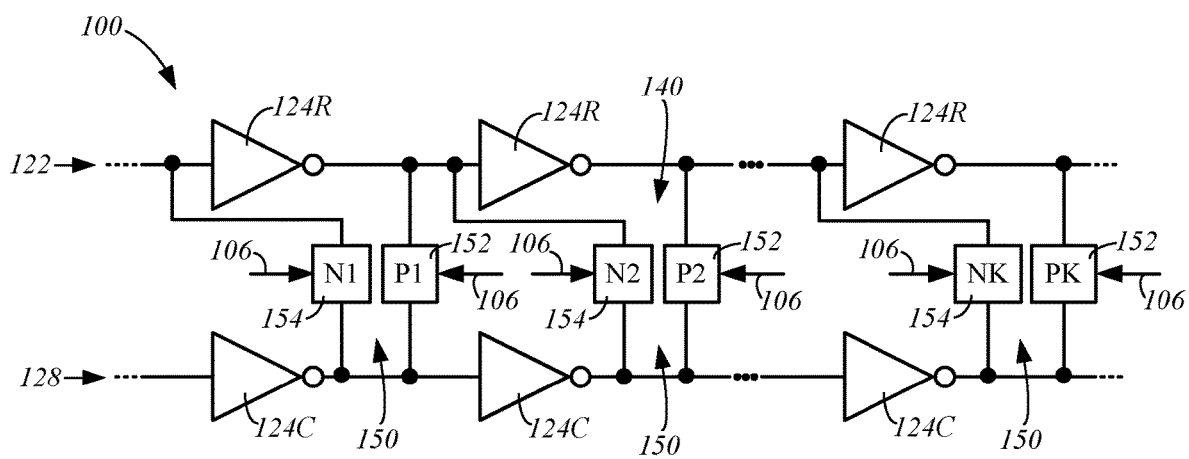
FIG. 7

CIRCUITRY HAVING FULLY CONNECTED RING OSCILLATORS

CROSS-REFERENCE TO RELATED APPLICATION

The present application is based on and claims the benefit of U.S. provisional patent application No. 63/272,795, filed Oct. 28, 2021, and U.S. provisional patent application No. 63/297,364, filed Jan. 7, 2022. The content of each of the above-identified provisional applications is hereby incorporated by reference in its entirety.

FIELD

The present disclosure relates to compute engine circuitry that includes a plurality of ring oscillators and, more specifically, to circuitry having fully connected ring oscillators that may be used to represent spin network mappings of systems for solving combinatorial optimization problems.

BACKGROUND

Combinatorial optimization problems (COPs), such as Boolean satisfiability, traveling salesman, and max-cut, are a class of nondeterministic polynomial-time hardness problems that are intractable to solve using a traditional computer due to the extremely large search space. Artificial intelligence decision making, vehicle routing, very large-scale integration layout optimization, network design, and many other modern applications can be modeled as COPs.

One promising approach to solving COPs involves transforming the COP into the Ising spin glass model, in which the COP is mapped to a network of spins. According to this approach, a graph representing a COP is formed, an example of which (graph 800) is illustrated in FIG. 8A. The graph 800 is then mapped to a network of spins 802, such as illustrated in FIG. 8B. In the mapping or network 802, the spins 804 represent the vertices 806 of the graph 800, and the couplings 808 between the spins 804 represent the edges 810 of the graph.

The COP is solved by letting the network naturally find its minimum energy state through coupling dynamics. Ideally, the energy of the system represented by the network 802 reaches the ground state or global minima 812 (FIG. 8C) based on the coupling of the spins 804, which is the solution of the COP.

The states of all the spins 804 (e.g., 1 for up-spin and −1 for down-spin) in the network 802 determine the Ising Hamiltonian function, which denotes the total energy of the system represented by the network 802, and is the solution to the COP.

Coupled ring oscillators have been used in compute engine circuitry to represent spin networks, such as discussed in U.S. Publication No. 2021/0312298.

Previous hardware implementations of spin networks require quantum devices operating at cryogenic temperatures, are based on digital logic without the coupling dynamics, or require special processes.

SUMMARY

Embodiments of the present disclosure are directed to a fully connected ring oscillator circuit, a chip architecture, and a method of solving a combinatorial optimization problem (COP) using compute engine circuitry that includes the ring oscillator circuit.

One embodiment of the fully connected ring oscillator circuit includes a plurality of first ring oscillator loops, a plurality of second ring oscillator loops, a plurality of ring oscillators and a plurality of coupled ring oscillators. Each first ring oscillator loop extends along a first axis. Each second ring oscillator loop extends along a second axis that is transverse to the first axis and intersects each of the first ring oscillator loops. Each ring oscillator includes one of the first ring oscillator loops connected to one of the second ring oscillator loops through a strong coupling, and is configured to produce an oscillating signal. Each coupled ring oscillator includes two of the ring oscillators that are connected to each other through a programmable weighted coupling block. Each programmable weighted coupling block is configured to selectively apply to the corresponding coupled ring oscillator a positive weight coupling that drives the oscillating signals of the ring oscillators of the coupled ring oscillator toward oscillating in a same phase with each other, and a negative weight coupling that drives the oscillating signals of the ring oscillators of the coupled ring oscillator toward oscillating in an opposite phase with each other.

An example of the chip architecture includes an array of fully connected ring oscillators. The array includes a plurality of rows of first ring oscillator loops, a plurality of columns of second ring oscillator loops each intersecting one of the rows, a plurality of ring oscillators and a plurality of coupled ring oscillators. Each ring oscillator includes one of the first ring oscillator loops connected to one of the second ring oscillator loops through a strong coupling, and is configured to produce an oscillating signal. Each coupled ring oscillator includes two of the ring oscillators connected to each other through a programmable weighted coupling block. Each programmable weighted coupling block is configured to selectively apply to the corresponding coupled ring oscillator a positive weight coupling that drives the oscillating signals of the ring oscillators of the coupled ring oscillator toward oscillating in a same phase with each other, and a negative weight coupling that drives the oscillating signals of the ring oscillators of the coupled ring oscillator toward oscillating in an opposite phase with each other.

In one embodiment of the method of solving a COP, a spin network mapping of a graph representing the COP is formed using compute engine circuitry. The circuitry includes a plurality of first ring oscillator loops each extending along a first axis, a plurality of second ring oscillator loops each extending along a second axis that is transverse to the first axis and intersecting the first ring oscillator loops, a plurality of ring oscillators, a plurality of coupled ring oscillators and a controller. Each ring oscillator producing an oscillating signal that represents a spin of the spin network mapping and including one of the first ring oscillator loops connected to one of the second ring oscillator loops through a strong coupling. Each coupled ring oscillator representing a connection between spins of the spin network mapping and comprising two of the ring oscillators connected to each other through a programmable weighted coupling block. The controller is configured to program each of the weighted coupling blocks in accordance with the spin network mapping to selectively apply to the corresponding coupled ring oscillator a positive weight coupling that drives the oscillating signals of the ring oscillators of the coupled ring oscillator toward oscillating in a same phase with each other, or a negative weight coupling that drives the oscillating signals of the ring oscillators of the coupled ring oscillator toward oscillating in an opposite phase with each other. The controller further configured to compare a relative phase of the oscillating signals of the coupled ring oscillators at different delay points and output a phase signal indicating a degree to which the oscillating signals are in phase with each other, and process the phase signals into a solution indicating a total energy of the spin network mapping.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

FIGS. 6A and 6B each include a simplified diagram of positive and negatively coupled ring oscillators, respectively, and waveforms of oscillating signals of the ring oscillators, in accordance with embodiments of the present disclosure.

FIG. 7 is a simplified diagram illustrating programmable weighted coupling block or circuit coupling row and column ring oscillator loops, in accordance with embodiments of the present disclosure.

DETAILED DESCRIPTION OF ILLUSTRATIVE EMBODIMENTS

Figure 1:
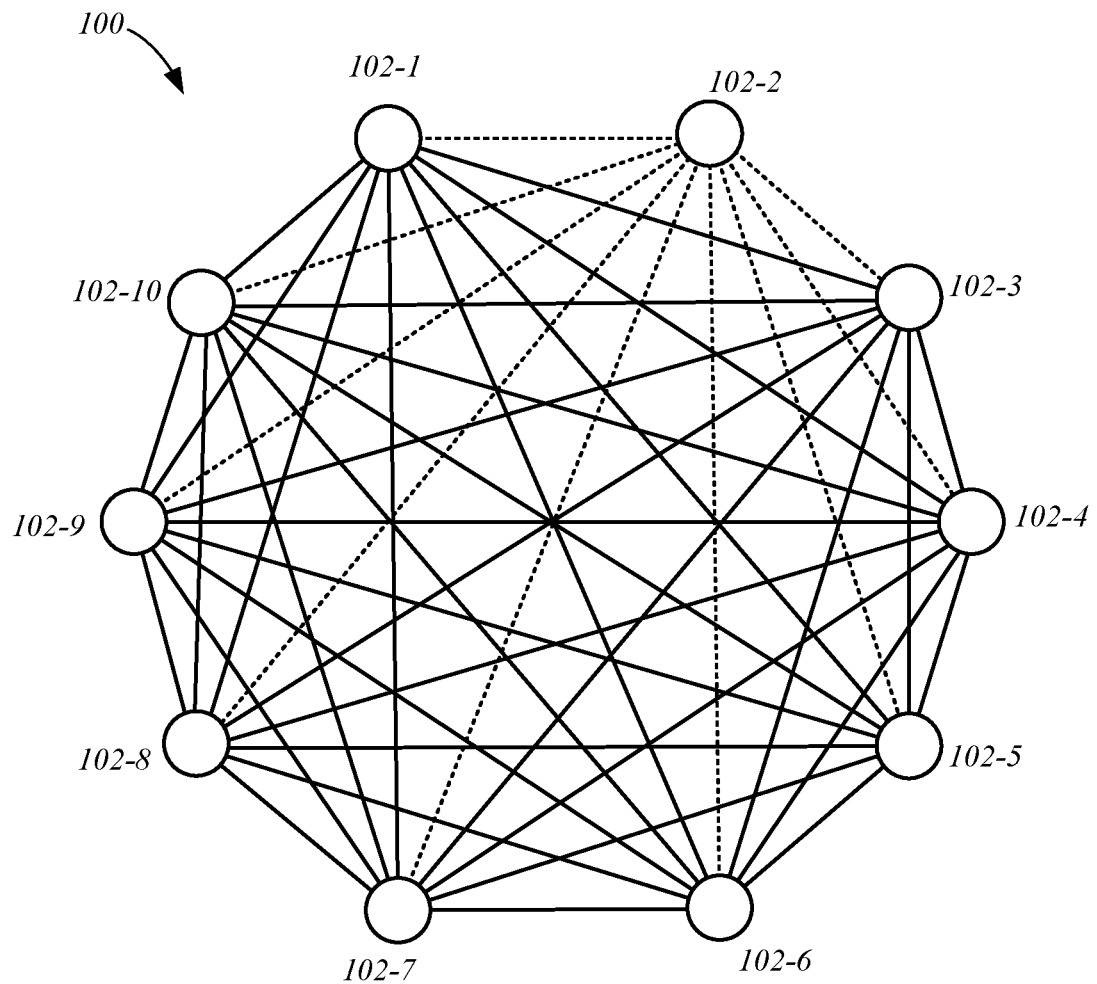
FIG. 1 is a simplified diagram of an example of compute engine circuitry representing a spin network mapping, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

Unless otherwise defined, all terms (including technical and scientific terms) used herein have the same meaning as commonly understood by one of ordinary skill in the art relating to the present disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present disclosure relate to a circuit of fully connected ring oscillators that may be used to represent spin network mappings and provide solutions to combinatorial optimization problems (COPs), such as the ground state of a cost function representing a hard optimization problem, for example. FIG. 1 is a simplified diagram of an example of compute engine circuitry 100 representing a spin network mapping. The circuitry 100 includes a fully connected group of ring oscillators 102, in which each ring oscillator 102 is connected to each of the other ring oscillators 102. The illustrated example includes ten fully coupled ring oscillators 102-1, 102-2, 102-3, 102-4, 102-5, 102-6, 102-7, 102-8, 102-9 and 102-10. Each ring oscillator 102 produces an oscillating signal, the phase of which may represent a "spin".

The connections between the ring oscillators 102, which are represented by the lines extending between the ring oscillators, causes the oscillating signal or spin of the connected ring oscillators 102 to oscillate in one of two states: either in the same-phase or in the opposite-phase. The connection between the ring oscillators 102 may be weighted either positively or negatively to represent a desired spin network mapping of a COP. When the spins of two ring oscillators 102 are coupled with a positive coupling weight, their oscillating signals or spin states will tend to resolve to the same phase or spin state as this minimizes the energy, and when two ring oscillators 102 are coupled with a negative coupling weight, their oscillating signals or spin states will tend to resolve to the opposite phase or spin state to minimize the energy.

When the connections and coupling weights between the ring oscillators 102 represent a spin network of a COP or hard optimization problem, the minimum energy state of the coupled ring oscillators 102 finds the optimum balance that minimizes the energy of the spin network and provides a solution to the problem represented by the spin network. For example, the connected ring oscillators 102 may be used to solve for the ground state of the cost function provided in equation 1.

$$E_{system} = \sum_{i=1}^{N} \sum_{j=1}^{ni} J_{ij} \cdot s_i \cdot s_j + \sum_{i=1}^{N} h_i \cdot s_i \qquad \text{Eq. 1}$$

Here, $J_{ij}$ represents coupling weights that are applied to the coupled ring oscillators 102 to model the affinity between spins $s_i$ and $s_j$ of the coupled ring oscillators 102, which can take either +1 or −1 values. The weighted connection is represented by the solid lines connecting the coupled ring oscillators 102 together in FIG. 1. The ring oscillator 102-1 may serve as a global reference for injecting the local field signal $h_i$ to the other ring oscillators 102, as represented by the dashed lines. A solution to the problem represented by the spin network mapping is provided by the minimum energy state of the system.

Figure 2:
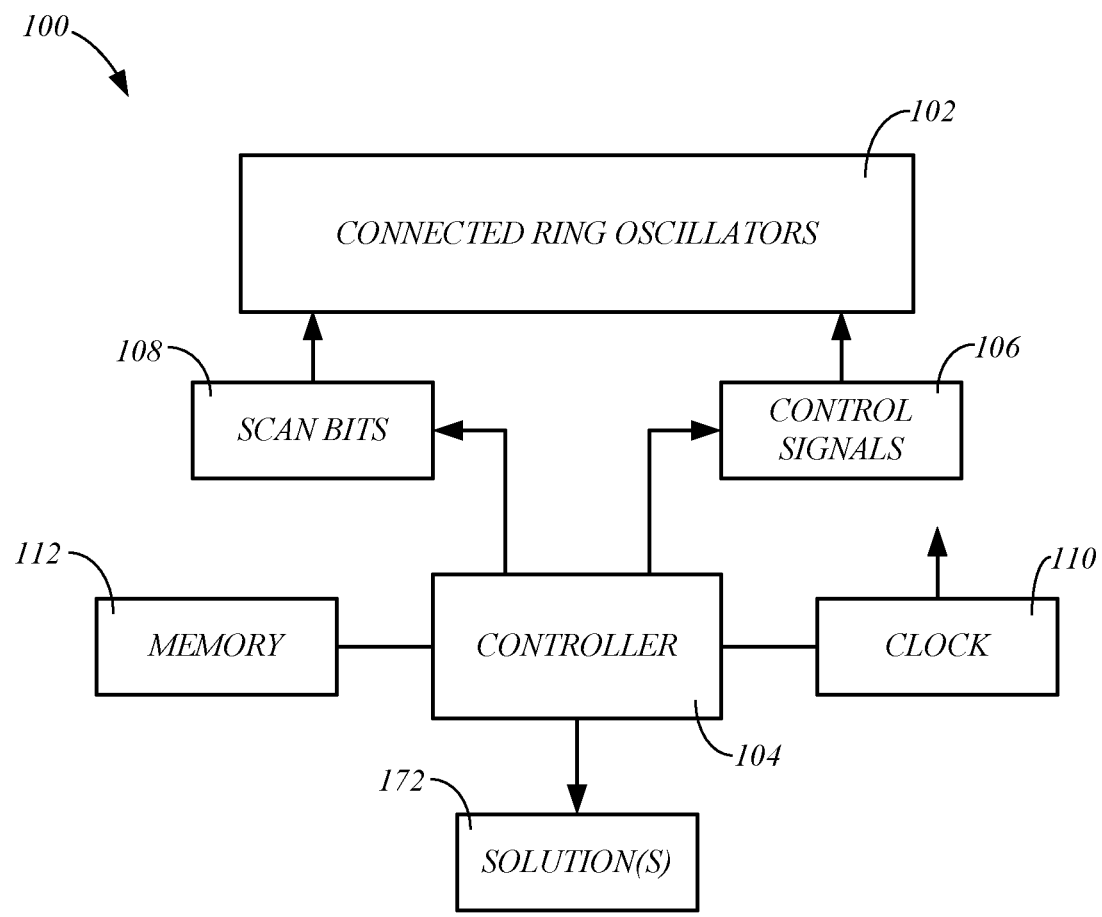
FIG. 2 is a simplified diagram of an example of compute engine circuitry, in accordance with embodiments of the present disclosure.

FIG. 2 is a simplified block diagram of an example of the circuitry 100, in accordance with embodiments of the present disclosure. In one embodiment, the circuitry 100 includes a controller 104 and a plurality of connected ring oscillators 102. The controller 104 represents one or more processors (e.g., a central processing unit) that control components of the circuitry 100 to perform one or more functions described herein. For example, the controller 104 may produce control signals 106 and program scan bits 108 for controlling the couplings of the ring oscillators 102 and the weights applied to the couplings between the ring oscillators 102 to form a representation of a spin network mapping of a COP. The controller 104 may also control a clock 110 (e.g., frequency and voltage level), which may be used to synchronize the ring oscillators 102.

The controller 104 performs its control functions in response to the execution of instructions, which may be stored in memory 112 that represents local and/or remote memory or computer readable media. The memory 112 comprises any suitable patent subject matter eligible computer readable media that do not include transitory waves or signals such as, for example, embedded memory circuits such as static random access memory, dynamic random access memory, or non-volatile memory, for example. The one or more processors of the controller 104 may be components of one or more computer-based systems, and may include one or more control circuits, microprocessor systems, and/or one or more programmable hardware components, such as a field programmable gate array (FPGA).

Figure 3:
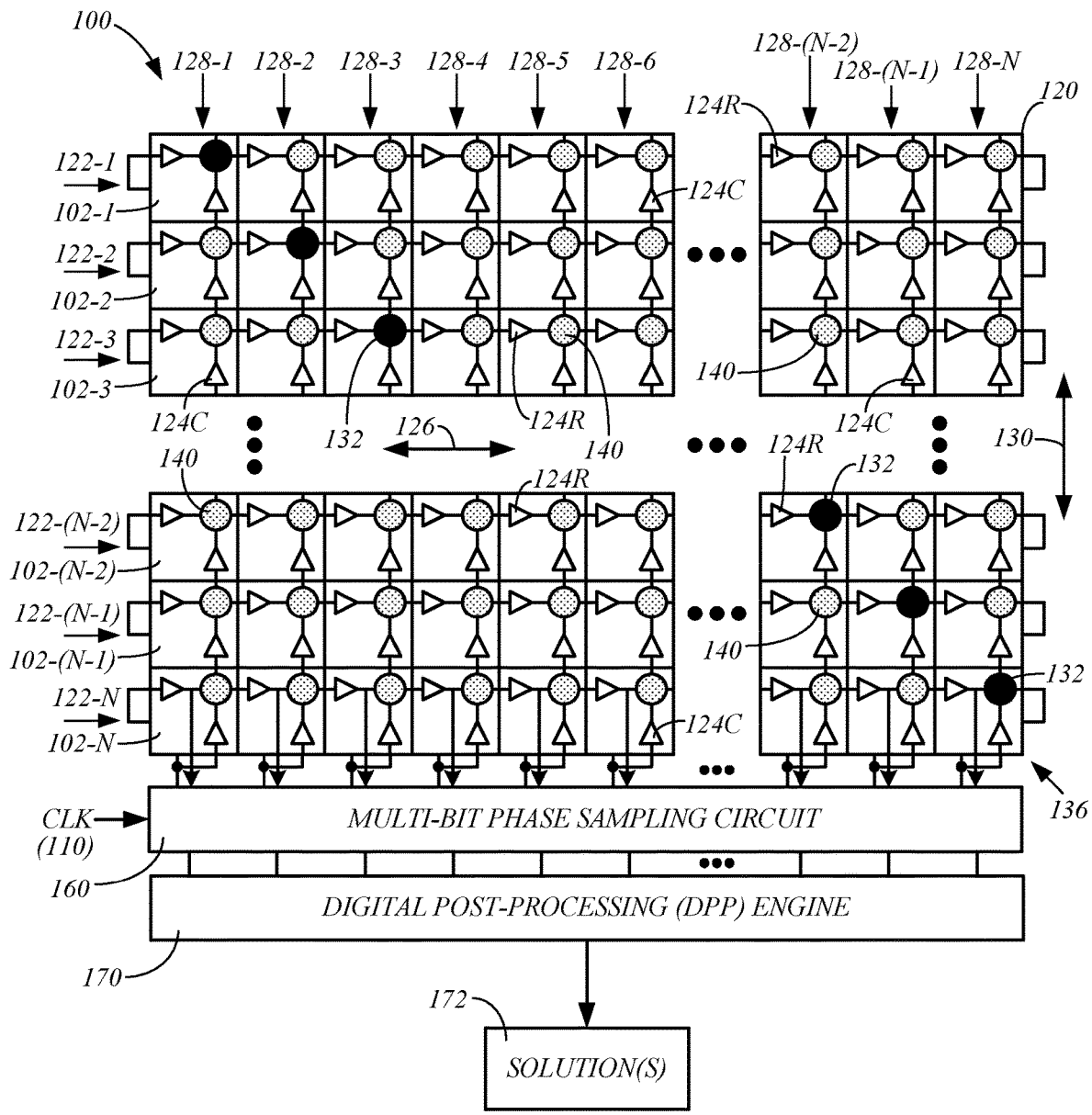
FIG. 3 is a simplified diagram of the compute engine circuitry, in accordance with embodiments of the present disclosure.

FIG. 3 is a simplified diagram of the circuitry 100 comprising fully connected ring oscillators 102 in accordance with embodiments of the present disclosure. In one embodiment, the ring oscillators 102 are organized as an array 120. The array 120 and other components of the circuitry 100 may be implemented in an integrated circuit chip architecture, such as one using standard complementary metal-oxide-semiconductor (CMOS) technology.

In one example, the array 120 includes N rows 122 of inverter gates 124R extending along an axis 126, and columns 128 of inverter gates 124C extending along an axis 130. The axes 126 and 130 are transverse to each other, such as perpendicular to each other, for example.

The output of each inverter gate 124R of a row 122 is coupled to the input of an adjoining inverter gate 124R in the row 122 and the output from the last inverter gate 124R of the row 122 is routed back to the input of the first inverter gate 124R to form an oscillator loop row that operates as a ring oscillator. Likewise, the output of each inverter gate 124C in a column 128 is coupled to the input of an adjoining inverter gate 124C of the column 128 and the output from the last inverter gate 124C of the column 128 is routed back to the input of the first inverter gate 124C of the column 128 to form an oscillator loop column that operates as a ring oscillator.

In one embodiment, each oscillator loop row 122 is connected to one of the oscillator loop columns 128 through a strong coupling 132 that substantially locks the phases of the oscillating signals in the oscillator loop row 122 and column 128 form a ring oscillator 102 that represents a single ring oscillator that produces an oscillating signal that oscillates between two voltage levels, which may represent a logic voltage (1 or 0) and a "spin". While the phases of the oscillating signals in the strongly coupled oscillator loop row 122 and column 128 may drift slightly (e.g., 1-2% shift in phase or about 3.6-7.2 degrees) as they travel through the loops 122 and 128, the phases realign at the strongly coupled cells. The strong coupling 132 may be formed through a suitable conductor to form a short between the connected oscillator loop row 122 and column 128. As discussed below, ring oscillators may also be formed through the connection of multiple oscillator loop rows 122 to multiple oscillator loop columns 128 using one or more strong couplings. Thus, the array may comprise up to N ring oscillators 102 depending on the manner in which the oscillator loop rows 122 and columns 128 are strongly coupled.

In one example, the strong couplings 132 connect the oscillator loop rows 122 and the oscillator loop columns 128 that intersect at a diagonal 136 of the array 120, as shown in FIG. 3. Accordingly, oscillator loop row 122-1 may be connected to oscillator loop column 128-1 to form ring oscillator 102-1, and oscillator loop row 122-2 may be connected to oscillator loop column 128-2 to form ring oscillator 102-2, etc. Other locations for the strong couplings 132 may also be used.

The array 120 may be configured to represent a desired number of ring oscillators 102 or spins, such as the 10 ring oscillators 102 (N=10) and spins shown in FIG. 1. The array of FIG. 3 may represent the 10 spins of FIG. 1 through 10 ring oscillators 102 (N=10). FIGS. 4 and 5 illustrate other examples of spin network mapping representations that may be provided by the array 120 having ten rows 122 and columns 128.

Figure 4A:
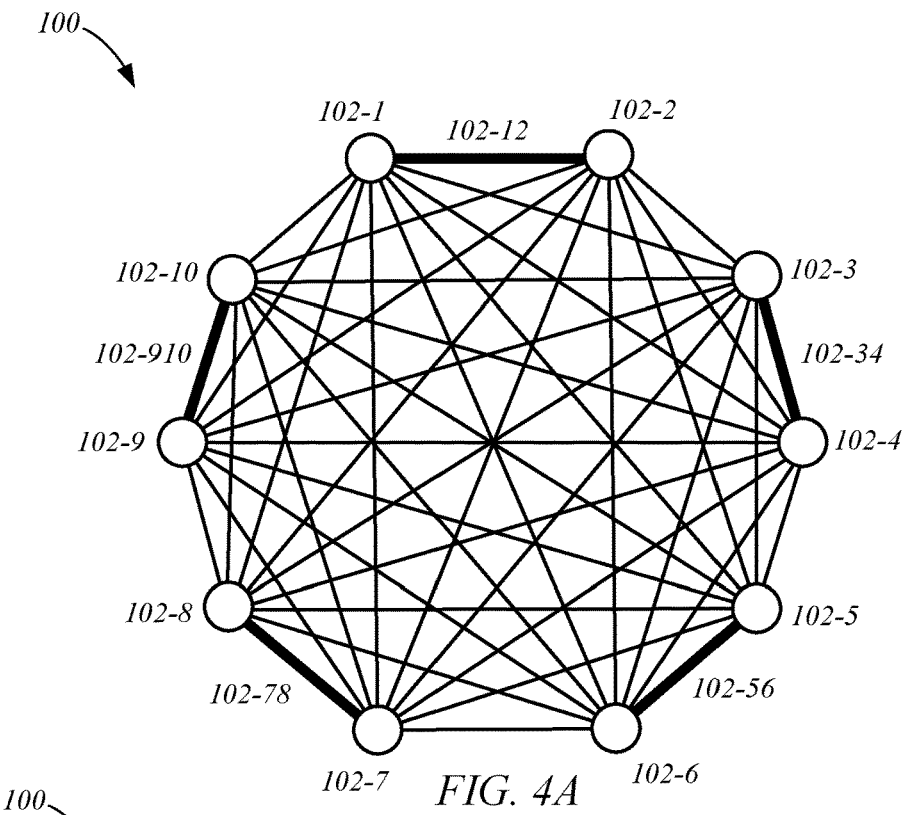
FIG. 4A is a simplified diagram of an example of the compute engine circuitry having 5 fully connected ring oscillators representing a spin network mapping of 5 spins, in accordance with embodiments of the present disclosure.

FIG. 4A is a simplified diagram of an example of the circuitry 100 having 5 fully connected ring oscillators 102 representing a spin network mapping of 5 spins. Strong couplings between the ring oscillators 102 of the circuitry 100 are represented by the thick lines connecting the ring oscillators 102 or spins. For example, ring oscillator or spin 102-1 is strongly coupled to ring oscillator or spin 102-2 to form an individual ring oscillator or spin 102-12, ring oscillator or spin 102-3 is strongly coupled to ring oscillator or spin 102-4 to form an individual ring oscillator or spin 102-34, etc.

Figure 4B:
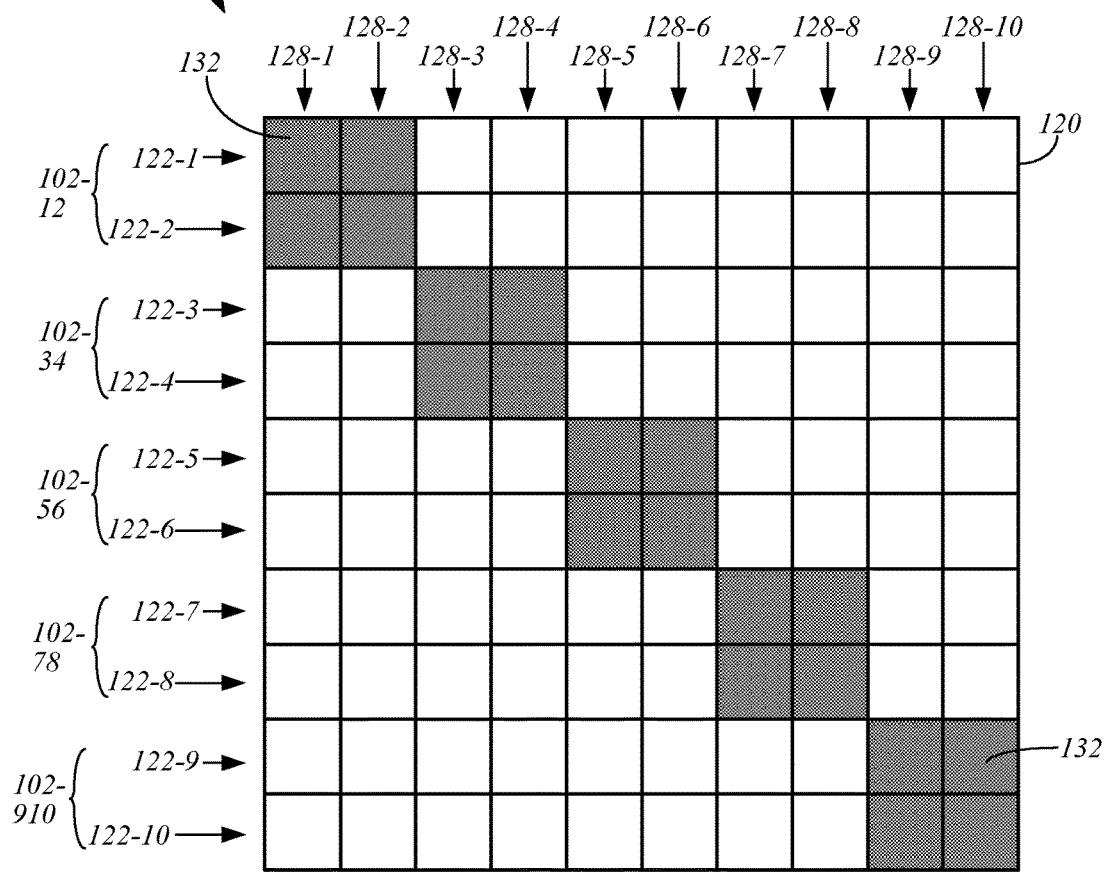
FIG. 4B illustrates an example of an array of the compute engine circuitry having strong couplings between ring oscillators to form the 5 spin example of FIG. 4A, in accordance with embodiments of the present disclosure.

FIG. 4B illustrates the array 120 of the circuitry 100 having strong couplings 132 (shaded cells) between the ring oscillators 102 to form the 5 spin example of FIG. 4A. In the example, the corresponding oscillating loop rows 122 and columns 128 are strongly coupled at their intersection. Additionally, one of the cells containing a pair of inverter gates 124R and 124C (FIG. 3) of each oscillating loop row 122 is strongly coupled to a cell of an adjoining oscillating loop row 122, and one of the cells of each oscillating loop column 128 is strongly coupled to a cell of an adjoining oscillating loop column 128 to join the ring oscillators 102 together. The strong coupling 132 of the ring oscillators 102 causes the oscillating signals of the ring oscillators 102 to oscillate in phase with each other and operate as a single ring oscillator that represents a spin. In the illustrated example, ring oscillators 102-1 and 102-2 are strongly coupled to form a ring oscillator 102-12, ring oscillators 102-3 and 102-4 are strongly coupled to form a ring oscillator 102-34, etc. As a result, the configuration of the array 120 in FIG. 4B represents the 3 spins or ring oscillators 102 shown in FIG. 4A.

Figure 5A:
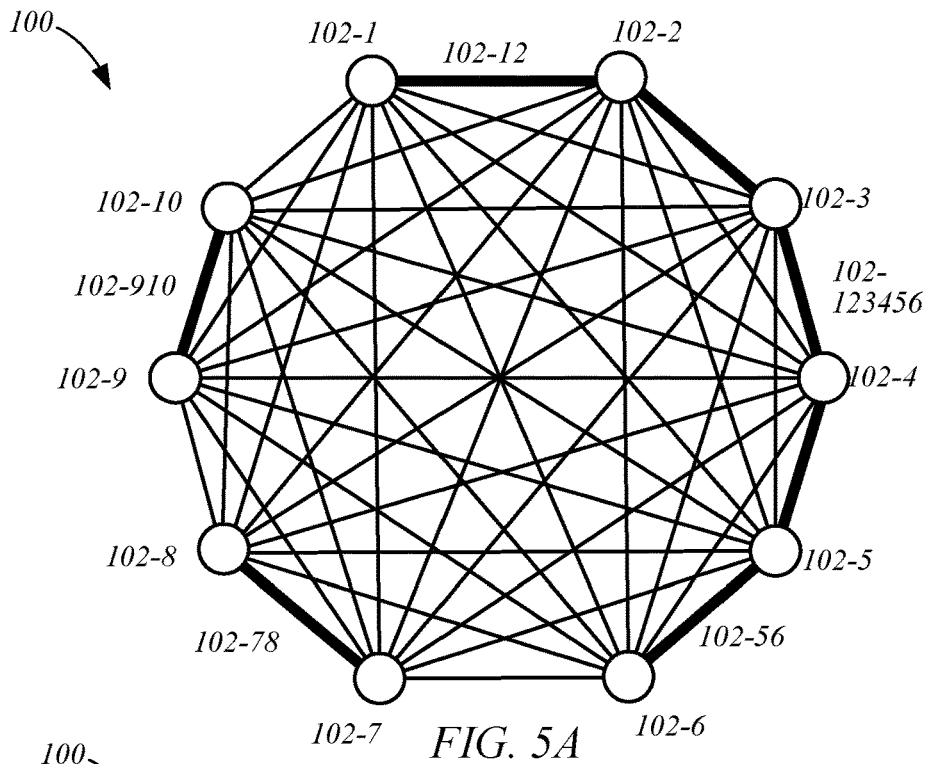
FIG. 5A is a simplified diagram of an example of the compute engine circuitry having 3 fully connected ring oscillators representing a spin network mapping of 3 spins, in accordance with embodiments of the present disclosure.

FIG. 5A is a simplified diagram of an example of the circuitry 100 having 3 fully connected ring oscillators 102 representing a 3 spin mapping. In this example, the ring oscillators 102-1, 102-2, 102-3, 102-4, 102-5 and 102-6 are strongly coupled together to form an individual ring oscillator 102-123456 representing a single spin, the ring oscillator 102-7 is strongly coupled to the ring oscillator 102-8 to form a ring oscillator 102-78 representing a single spin, and the ring oscillator 102-9 is strongly coupled to the ring oscillator 102-10 to form an individual ring oscillator 102-910 representing a single spin.

Figure 5B:
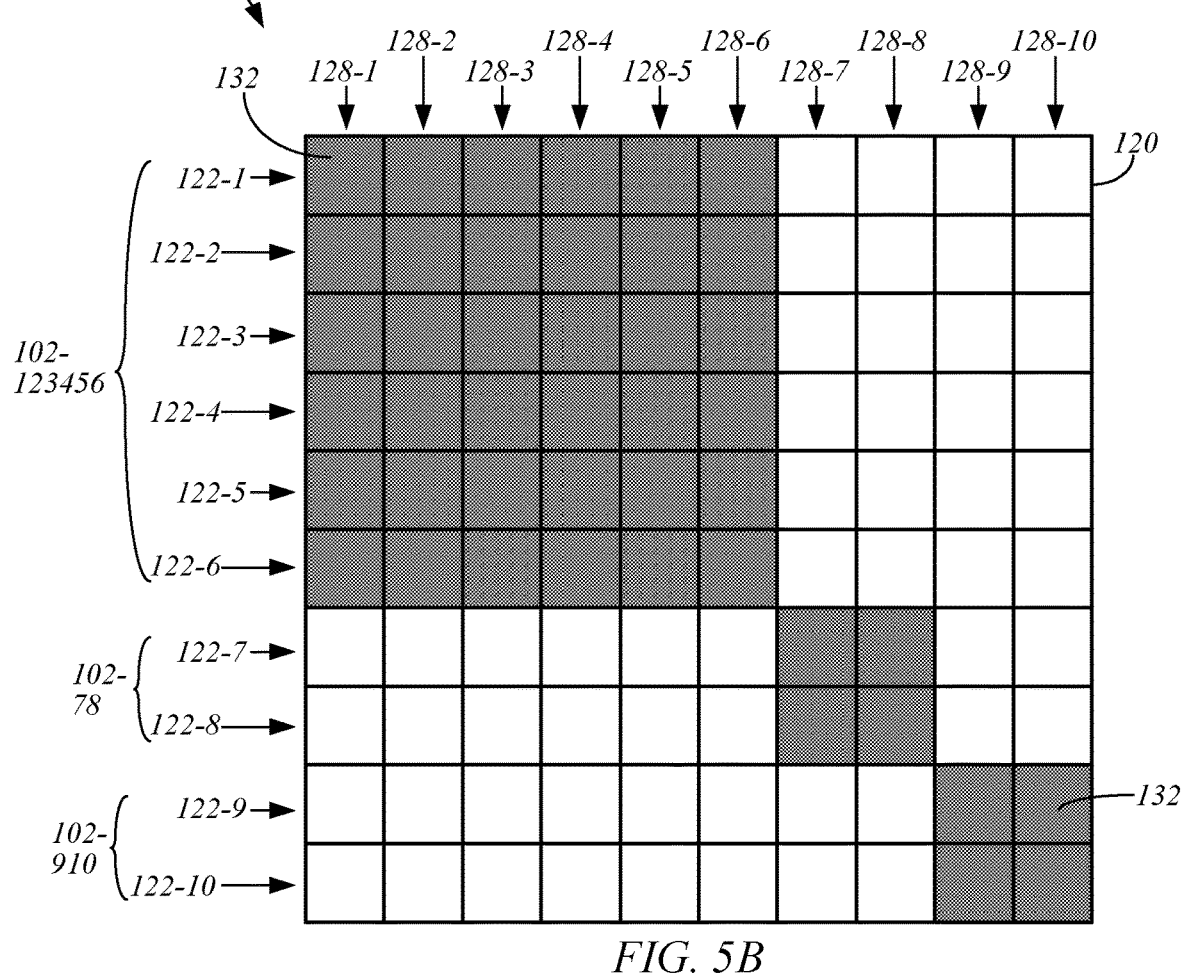
FIG. 5B illustrates an example of an array of the compute engine circuitry having strong couplings between ring oscillators to form the 3 spin example of FIG. 5A, in accordance with embodiments of the present disclosure.
Figure 8A:
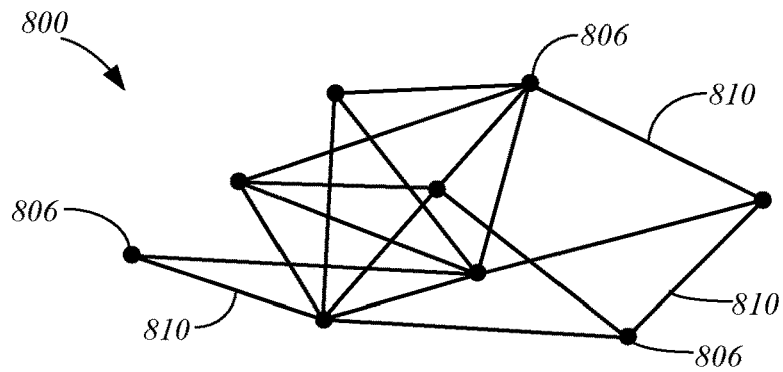
FIGS. 8A-C respectively illustrate examples of a graph representing a COP, a network of spins representing the graph, and a chart illustrating energy of the network, which are used to solve the COP.
Figure 8B:
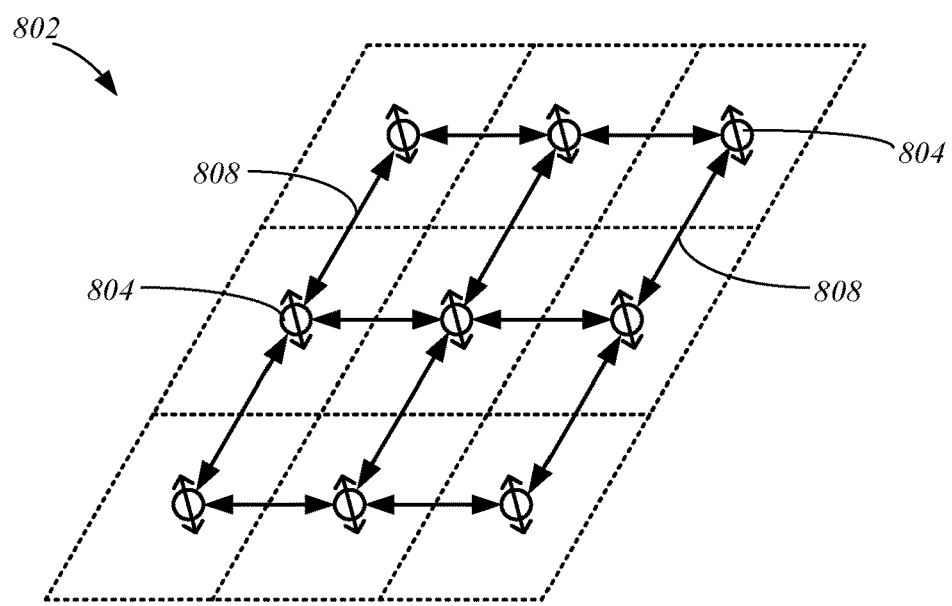
Figure 8C:
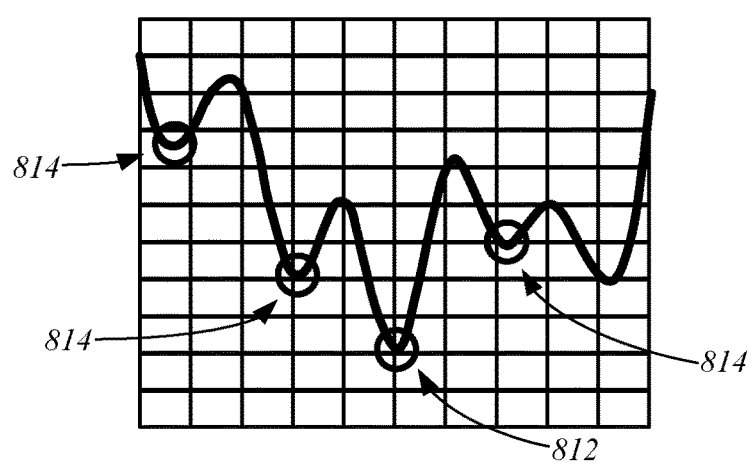

FIG. 5B illustrates the corresponding strong couplings (shaded cells) between the ring oscillators 102 of the array 120 to form the 3 spin example of FIG. 5A. Thus, the corresponding row and column oscillating loops 122 and 128 corresponding to the ring oscillators 102-1, 102-2, 102-3, 102-4, 102-5 and 102-6 are strongly coupled at their intersections to form the ring oscillator 102-123456 representing a single spin, the corresponding row and column oscillating loops 122 and 128 corresponding to the ring oscillators 102-7 and 102-8 are strongly coupled at their intersections to form a ring oscillator 102-78 representing a single spin, and the oscillating loops 122 and 128 corresponding to the ring oscillators 102-9 and 102-10 are strongly coupled at their intersections to form a ring oscillator 102-910 representing a single spin. As a result, the illustrated configuration of the array 120 of FIG. 5B represents the 5 spins or ring oscillators 102 shown in FIG. 5A.

As mentioned above, a spin network mapping of a COP may be represented through a weighted connection between coupled pairs of ring oscillators 102. In one embodiment, this is accomplished in the circuitry 100 by programmable weighted coupling blocks or circuits (hereinafter "coupling blocks") 140. Each coupling block 140 joins a pair of the ring oscillators 102 together to form coupled ring oscillators. The weighted coupling blocks 140 may apply a weight having a positive or negative polarity to the coupled ring oscillators 140 that either drives the oscillating signals of the coupled ring oscillators 102 toward oscillating in the same phase (positive weight) or drives the oscillating signals of the coupled ring oscillators 102 toward oscillating in the opposite phase (negative weight).

The coupling blocks 140 may connect the oscillator loop rows 122 of each ring oscillator 102 to the intersecting oscillator loop columns 128 of the other ring oscillators 102, and/or the coupling blocks 140 may connect the oscillator loop columns 128 of each ring oscillator 102 to the intersecting oscillator loop rows 122 of the other ring oscillators 102, as shown in FIG. 3 to form the desired weighted couplings between the ring oscillators 102. For example, the output of each inverter gate 124R of an oscillator loop row 122 may be connected to the output of the inverter gate 124C in the cell of the intersecting oscillator loop column 128 through a coupling block 140, and each inverter gate 124C of an oscillator loop column 128 may be connected to the output of the inverter gate 124R in the cell of the intersecting oscillator loop row 122 through a coupling block 140, except at the strongly connected cells along the diagonal 136 of the array. In this manner, the coupling blocks 140 may be used to form the all-to-all coupled ring oscillators 102 shown in FIG. 1.

In some embodiments, the weighted coupling applied by the coupling blocks 140 between a pair of ring oscillators 102 is used to manipulate the signal delay of the oscillating loops 122 and 128 of the coupled ring oscillators 102 such that the two coupled nodes eventually lock into the same or opposite phases depending on the coupling polarity. To illustrate this concept, consider the operation of the coupled ring oscillators 102 of FIGS. 6A and 6B. In the illustrated example, each of the ring oscillators 102 includes a series of CMOS inverter gates 124 and the coupling block 140 includes a CMOS transmission gate 142. In FIG. 6A, the coupling block 140 provides a positive coupling of the ring oscillators 102, whereas in FIG. 6B, the coupling block 140 provides negative coupling of the ring oscillators 102. Below each coupled ring oscillator circuit are waveforms illustrating an evolution of the oscillating signals 144 of the ring oscillators 102 at nodes of the circuit over time after the activation of the coupling block 140. The shaded boxes overlaying the waveforms illustrate the amount the oscillating signals are out of phase with each other.

The activation of the coupling block in FIG. 6A, such as through a control signal 106 from the controller 104 (FIG. 2), connects the nodes A' and B' together. If the oscillating signal 144 at B' switches slightly earlier than the oscillating signal 144 at A', the switching of signal 144 at B' is impeded by the state of signal 144 at A' while the switching of the signal 144 at A' is accelerated by the state of signal 144 at B', until the two coupled oscillating signals 144 at A' and B' are synchronized to the same phase. In the case that the signal 144 at A' overtakes and passes the signal 144 at B', then the opposite signals 144 are impeded or accelerated which brings the two signal edges back closer to each other and more in phase. Similarly, if the nodes A and B' are negatively coupled, as shown in FIG. 6B, the oscillating signals 144 at the nodes A' and B' will be driven toward opposite phases, and ultimately results in the signals 144 at A' and B' having opposite phases, as shown in the corresponding waveform.

One example of a programmable weighted coupling block or circuit 140 that may be used to couple the ring oscillator loops 122 and 128 of a pair of ring oscillators 102 of the array 120 and form coupled ring oscillators is shown in FIG. 7. The coupling block 140 includes a plurality coupling stages 150, each having a positive coupling 152 (P1, P2, . . . Pk) and a negative coupling 154 (e.g., N1, N2, . . . Nk). In some embodiments, the circuit 100 includes a coupling stage 150 for each inverter gate 124 or element of the ring oscillators 102.

Each positive coupling 152 may be configured to connect nodes at the outputs of the corresponding inverter gates 124R and 124C to each other to couple the same phase signals 144 of the ring oscillators 102 together, and each negative coupling 154 may be configured to connect a node at an input to an inverter gate 124 of the oscillator loop 122 to a node at the output of the corresponding inverter gate 124C of the oscillator loop 128 to couple the opposite phase signals of the ring oscillators 102. Each of the positive and negative couplings 152 and 154 may comprise a CMOS switch circuit that may be independently enabled using a suitable control signal 106 from the controller 104 to provide a parallel connection of the oscillator loops 122 and 128, or disabled to block the connection.

This arrangement allows for the programmed application of various coupling weights having a positive or negative polarity. When none of the positive or negative weight couplings 152 and 154 are activated, a weight of W=0 is applied to the ring oscillator loops 102. Positive weights may be applied through the enablement of one or more of the positive weight couplings 152. For example, a weight of W=+1 may be applied when only one positive weight coupling 152 (e.g., P1) is enabled, a weight of W=+2 may be applied when two of the positive weight couplings 152 are enabled (e.g., P1 and P2), and so on. Likewise, negative weights may be applied through the enablement of one or more of the negative weight couplings 154. Thus, a weight of W=−1 may be applied to the loops when only one negative weight coupling 154 (e.g., N1) is enabled, a weight of W=−2 may be applied to the loops when two of the negative weight couplings 154 are enabled (e.g., N1 and N2), and so on. Accordingly, the range of weights that may be applied is scalable based on the number of coupling stages. Accordingly, a coupling block 140 having, for example, seven coupling stages 150 may apply coupling weights of W=−7 to W=+7.

The systematic delay shift introduced by one inverter phase delay is 1/N where N is the number of inverter stages 124 of the ring oscillator 102. For a value of N=350 (e.g., 7 coupling stages, 50 all-to-all ring oscillators), this translates to a negligible phase error of 0.3% or 1.0 degree. The configuration of the coupling block 140 of FIG. 7 provides a symmetric and uniform coupling behavior over the entire weight range (e.g., +/−7).

In one embodiment, the programmable weighted coupling block or circuit 140 employs transmission gates, such as parallelly connected p-type and n-type transistors, to provide symmetric resistive weight couplings between the two ring oscillator loops 122 and 128. As discussed above, the number of weight levels is proportional to the number of coupling stages 150. Thus, for an oscillator loop having 7 inverters and 14 weight couplings (7 positive weight couplings and 7 negative weight coupling), there are 15 distinct weight levels, from —7 to +7, with a uniform step size of 1. In one example, the circuit has stage counts of 7, 15, or 31 rather than stage counts of 8, 16, and 32, respectively, to provide an area-efficient implementation of weight and memory circuits. The advantage of the selected stage counts can be understood by the following example: 7 weight couplings can be programmed using 3 bits (=$b_1 \times 2^0 + b_2 \times 2^1 + b_3 \times 2^2$) but 8 coupling devices require an extra bit, which incurs a 4/3=1.33X memory overhead.

Embodiments of the circuitry 100 allow for higher resolution weights by simply cascading additional coupling stages. For example, since the coupling weight between two ring oscillators 102 can be implemented along intersections of the oscillator loop rows 122 and the oscillator loop columns 128, the maximum achievable weight resolution is twice the maximum weight of a single coupling location. When each oscillator loop of the array includes, for example, 7 inverter stages, the maximum number of coupling levels is −14 to +14 leveraging the two off-diagonal coupling locations. Increasing the number of delay stages per cell to 15 or 31 can further improve the resolution to 31 and 63 levels, respectively. This unique property ensures a more uniform and constant step size, which translates into a more accurate weight value even for large arrays 120.

Additionally, the frequency of the ring oscillators can be adjusted/tuned to overcome variation effects and facilitate the coupling interaction. This improves the accuracy of the coupling weights allowing higher resolution weights to be programmed in each intersection of the ring oscillators in the array.

In some embodiments, the circuitry 100 or portions thereof may be integrated into a semiconductor chip. For example, each unit cell of the array 120 located at the intersection of an oscillator loop row 122 and column 128 may be fabricated to include local SRAM memory for storing the coupling weights, the ring oscillator stages, and the coupling blocks 140.

In some embodiments, the circuitry 100 includes a multi-bit phase sampling circuit 160 (e.g., standard flip-flop circuit), as shown in FIG. 3, which may be represented by the controller 104 in FIG. 2. The phase sampling circuit 160 compares the relative phase of the oscillating signals of the row and column ring oscillators at the edge of the array 120 and outputs a phase signal indicating a degree to which the oscillating signals (spin states) are in phase with each other. The implementation involves delaying one of the oscillating signals with respect to the other to sample the other oscillating signal at different phase delay points. The phase sampling circuit compares the oscillating signal in each column 128 with the oscillating signal in the shared row (e.g., compares oscillating signal of oscillator loop row 122-1 to ring oscillator column 128-3, etc.) using parallel phase sampling circuits to take the snapshot of the phases. The sampled data, which may be stored in flip-flops, can be either read out to the controller 104 or another component, or internally processed to determine the binary (0° or 180°) or non-binary (0°, 90°, 180° or 270°) spin states.

A digital post-processing (DPP) engine 170 (FIG. 3), which may be represented by the controller in FIG. 2, may be positioned adjacent to the analog array 120. The DPP engine 170 is responsible for converting the sampled phase information output from the phase sampling circuit 160 to high quality solutions 172 (FIG. 2). For example, the DPP engine 170 may correct bit errors in the sampled bit stream (e.g., a lone 0 in a stream of 1's or vice versa) by a majority voting scheme which has an extremely low overhead. Also, the DPP engine 170 may rank the solution accuracy in real time to maintain only the best solutions 172 until the computation time is expired. Having a chip architecture that places the circuitry of the DPP engine 170 close to the analog array 120 provides high overall computational and data storage efficiency compared to an arrangement where the data must be transferred to a general-purpose central processing unit.

Some embodiments of the present disclosure are directed to a method of using the compute engine circuitry 100 described above to solve a COP. In one embodiment, a spin network mapping 802 of a graph 800 representing the COP is formed using the compute engine circuitry 100 in accordance with one or more embodiments described above. For example, the spin network mapping 802 may be formed by the controller 104 controlling the ring oscillators 102 of the array 120 and their connections to each other, as well as the weight of the couplings through the coupling blocks 140. A phase sampling circuit 160 may be used to compare the relative phase of the oscillating signals of the coupled ring oscillators 102 at different delay points. The sampled phase information may be processed, such as by the DPP engine 170, to determine a solution 172 to the COP.

Although the embodiments of the present disclosure have been described with reference to preferred embodiments, workers skilled in the art will recognize that changes may be made in form and detail without departing from the spirit and scope of the present disclosure.

What is claimed is:

1. A fully connected ring oscillator circuit comprising:
a plurality of first ring oscillator loops each extending along a first axis;
a plurality of second ring oscillator loops each extending along a second axis that is transverse to the first axis and intersecting the first ring oscillator loops;
a plurality of ring oscillators each comprising one of the first ring oscillator loops connected to one of the second ring oscillator loops through a strong coupling, each ring oscillator producing an oscillating signal; and
a plurality of coupled ring oscillators each comprising two of the ring oscillators connected to each other through a programmable weighted coupling block, wherein each of the programmable weighted coupling blocks is configured to selectively apply to the corresponding coupled ring oscillator a positive weight coupling that drives the oscillating signals of the ring oscillators of the coupled ring oscillator toward oscillating in a same phase with each other, and a negative weight coupling that drives the oscillating signals of the ring oscillators of the coupled ring oscillator toward oscillating in an opposite phase with each other.

2. The fully connected ring oscillator circuit of claim 1, wherein the first and second ring oscillator loops each comprise a plurality of inverter gates connected in series, wherein each inverter gate has an output that is connected to the input of a next inverter gate of the series, and the output of a last inverter gate of the series is connected to the input of a first inverter gate of the series.

3. The fully connected ring oscillator circuit of claim 2, wherein the strong coupling of each ring oscillator forces the oscillating signal in the first ring oscillator loop of the ring oscillator to be substantially in a same phase as the oscillating signal in the second ring oscillator loop of the ring oscillator.

4. The fully connected ring oscillator circuit of claim 3, wherein each strong coupling comprises a shorted connection.

5. The fully connected ring oscillator circuit of claim 3, wherein each of the first ring oscillator loops forms a row of an array and each of the second ring oscillator loops forms a column of the array that intersects each of the rows.

6. The fully connected ring oscillator circuit of claim 5, wherein each ring oscillator comprises one of the first ring oscillator loops and one of the second ring oscillator loops that intersect at a diagonal of the array.

7. The fully connected ring oscillator circuit of claim 5, wherein one or more of the ring oscillators comprises a plurality of the first ring oscillator loops connected to a plurality of the second ring oscillator loops through a plurality of strong couplings.

8. The fully connected ring oscillator circuit of claim 5, including a phase sampling circuit at an edge of the array configured to compare a relative phase of the oscillating signals of the first and second ring oscillator loops at the edge of the array at different delay points and output a phase signal indicating a degree to which the oscillating signals are in phase with each other.

9. The fully connected ring oscillator circuit of claim 8, including a processor configured to process the phase signals from the phase sampling circuit into a solution of a combinatorial optimization problem represented by the array.

10. A chip architecture including an array of fully connected ring oscillators comprising:
a plurality of first ring oscillator loops each extending along a first axis;
a plurality of second ring oscillator loops each extending along a second axis that is transverse to the first axis and intersecting one of the first ring oscillator loops;
a plurality of ring oscillators each comprising one of the first ring oscillator loops connected to one of the second ring oscillator loops through a strong coupling, each ring oscillator producing an oscillating signal; and
a plurality of coupled ring oscillators each comprising two of the ring oscillators connected to each other through a programmable weighted coupling block,
wherein each of the programmable weighted coupling blocks is configured to selectively apply to the corresponding coupled ring oscillator a positive weight coupling that drives the oscillating signals of the ring oscillators of the coupled ring oscillator toward oscillating in a same phase with each other, and a negative weight coupling that drives the oscillating signals of the ring oscillators of the coupled ring oscillator toward oscillating in an opposite phase with each other.

11. The chip architecture of claim 10, wherein the first and second ring oscillator loops each comprise a plurality of inverter gates connected in series, wherein each inverter gate has an output that is connected to the input of a next inverter gate of the series, and the output of a last inverter gate of the series is connected to the input of a first inverter gate of the series.

12. The chip architecture of claim 11, wherein the strong coupling of each ring oscillator forces the oscillating signal in the first ring oscillator loop of the ring oscillator to be substantially in a same phase as the oscillating signal in the second ring oscillator loop of the ring oscillator.

13. The chip architecture of claim 12, wherein each strong coupling comprises a shorted connection.

14. The chip architecture of claim 13, wherein each ring oscillator comprises one of the first ring oscillator loops and one of the second ring oscillator loops that intersect at a diagonal of the array.

15. The chip architecture of claim 14, wherein one or more of the ring oscillators comprises a plurality of the first ring oscillator loops connected to a plurality of the second ring oscillator loops through a plurality of strong couplings.

16. The chip architecture of claim 10, including a phase sampling circuit at an edge of the array configured to compare the relative phase of the oscillating signals of the first and second ring oscillator loops at the edge of the array at different delay points and output a phase signal indicating a degree to which the oscillating signals are in phase with each other.

17. The chip architecture of claim 16, including a processor configured to process the phase signals from the phase sampling circuit into a solution indicating a total energy of a spin network represented by the array.

18. A method of solving a combinatorial optimization problem (COP) comprising:
forming a spin network mapping of a graph representing the COP using compute engine circuitry, the circuitry comprising:
a plurality of first ring oscillator loops each extending along a first axis;
a plurality of second ring oscillator loops each extending along a second axis that is transverse to the first axis;
a plurality of ring oscillators each producing an oscillating signal that represents a spin of the spin network mapping and comprising one of the first ring oscillator loops connected to one of the second ring oscillator loops through a strong coupling, each ring oscillator producing an oscillating signal representing the spin; and
a plurality of coupled ring oscillators each representing a connection between spins of the spin network mapping and comprising two of the ring oscillators connected to each other through a programmable weighted coupling block; and
a controller configured to:
program each of the weighted coupling blocks in accordance with the spin network mapping to selectively apply to the corresponding coupled ring oscillator a positive weight coupling that drives the oscillating signals of the ring oscillators of the coupled ring oscillator toward oscillating in a same phase with each other, or a negative weight coupling that drives the oscillating signals of the ring oscillators of the coupled ring oscillator toward oscillating in an opposite phase with each other;

compare a relative phase of the oscillating signals of the coupled ring oscillators at different delay points and output a phase signal indicating a degree to which the oscillating signals are in phase with each other; and process the phase signals into a solution indicating a total energy of the spin network mapping.

19. The method of claim 18, wherein each of the first ring oscillator loops forms a row of an array and each of the second ring oscillator loops forms a column of the array that intersects each of the rows.

20. The method of claim 19, wherein:

the strong coupling of each ring oscillator forces the oscillating signal in the first ring oscillator loop of the ring oscillator to be substantially in a same phase as the oscillating signal in the second ring oscillator loop of the ring oscillator; and each ring oscillator comprises one of the first ring oscillator loops and one of the second ring oscillator loops that intersect at a diagonal of the array.

\* \* \* \* \*